United States Patent [19]
Bonis

[11] 3,963,315
[45] June 15, 1976

[54] SEMICONDUCTOR CHIP CARRIER AND TESTING FIXTURE

[75] Inventor: Scott A. Bonis, Sunnyvale, Calif.

[73] Assignee: Lockhead Missiles & Space Company, Inc., Sunnyvale, Calif.

[22] Filed: Apr. 7, 1975

[21] Appl. No.: 565,637

[52] U.S. Cl. ...................... 339/17 CF; 174/52 FP
[51] Int. Cl.² ........................................... H05K 1/12
[58] Field of Search ............ 339/17 C, 17 CF, 17 L, 339/17 M, 17 LM; 174/52 FP

[56] References Cited
UNITED STATES PATENTS

| | | | |
|---|---|---|---|
| 3,354,394 | 11/1967 | James | 339/17 CF |
| 3,678,385 | 7/1972 | Bruner | 339/17 CF |
| 3,710,299 | 1/1973 | Weisenburger | 339/17 CF |

FOREIGN PATENTS OR APPLICATIONS

| | | | |
|---|---|---|---|
| 2,056,193 | 8/1971 | Germany | 339/17 CF |

*Primary Examiner*—Joseph H. McGlynn
*Assistant Examiner*—Craig R. Feinberg
*Attorney, Agent, or Firm*—H. Donald Volk; B. G. Corber

[57] ABSTRACT

An improved carrier for semiconductor chips is described. The carrier includes a base, a substrate including electrical conductors and a rectangular aperture for receiving the semiconductor chip mounted on the base. A transparent cover is installed over the chip and is retained there by a resilient metallic clip.

5 Claims, 4 Drawing Figures

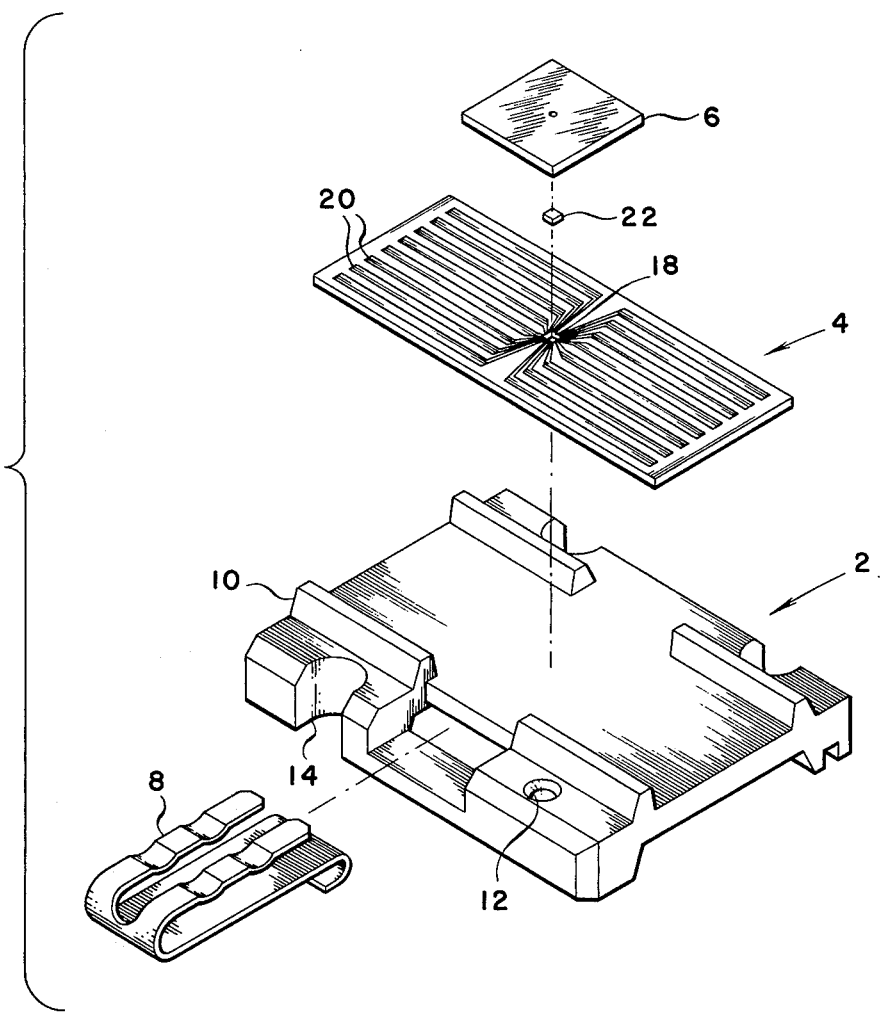
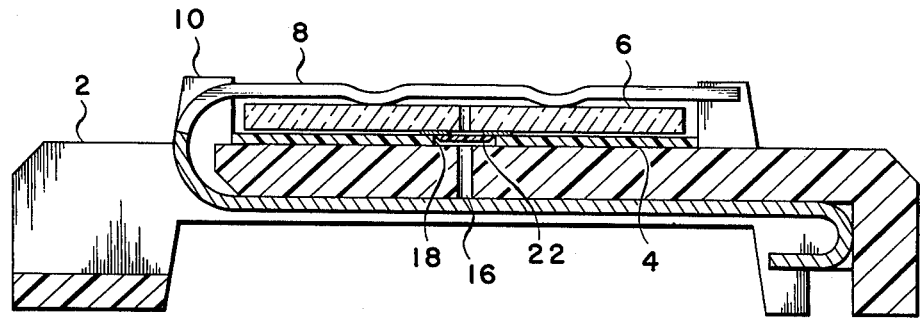

SEMICONDUCTOR CHIP CARRIER AND TESTING FIXTURE

BACKGROUND

This invention relates to an integrated circuit carrier and testing fixture. More particularly, this invention relates to an improved carrier which permits the integrated circuit or semiconductor chip to be inspected and tested both electrically and environmentally with a minimum of direct handling while protecting the chip against damage.

Typically, a plurality of identical semiconductor chips are formed on a wafer where they can be subjected to limited tests. After these tests, the chips, which are typically about a sixteenth of an inch square, are separated and then each chip is mounted in an integrated circuit package. The package, in turn, can be mounted in a carrier, such as shown in Barnes U.S. Pat. No. 3,409,861, and then tested and inspected by conventional methods set forth in that patent.

In many applications it is desirable to reduce the size of the electronic equipment. It also is important to reduce the weight of electronic equipment as well as other devices used in satellites and the like. One technique is to not mount the semiconductor chip in an IC package, but to mount it directly to a hybrid circuit. However, due to the inordinately small size of the semiconductor chip it is not possible to perform a number of tests on it.

Attempts have been made to develop a carrier and holding fixture for the uncased semiconductor chip that would allow the semi-conductor chip to be subjected to electrical and environmental testing as well as a short period of actual operation, commonly referred to as "burn-in". See U.S. Pat. No. 3,823,350. One problem is the beam leads on the semiconductor chip, being made up of gold deposited over platinum, tend to weld themselves to the gold plated copper leads on the carrier. Another problem is that the prior carriers, since they contain a plastic cover that springs against a semiconductor chip to hold the chip in position, cannot be used at elevated temperature within the desirable range because the plastic loses its resiliency at the higher temperature which can allow the chip to move, thus subjecting the semiconductor chip to possible damage and possible loss of electrical contact to the chip.

Still another problem inherent in the prior art carriers is that the non-uniformity of size of the various pieces due to manufacturing tolerances allows the beam leads on the chip to contact more than one conductor, or no conductors, whereby the chip can be damaged when power is applied. Specifically, in the prior art carriers, the printed circuit board or other device supporting the conductive traces must be lined up with the base of the carrier. In turn, the cover, which determines the position of the semiconductor chip, also must be lined up with the base of the carrier. Since the beam leads from the carrier are only approximately 5 mils (0.005 inches) wide and the beam leads are spaced apart by approximately 5 mils, any misalignment of the chip carrier base with the printed circuit board or the cover can cause the chip to not make a proper connection with the copper traces and the application of current could destroy the chip.

Yet another problem is that the chip can be easily damaged when it is being loaded or unloaded from the carrier. The beam leads of the semiconductor chip are so small and delicate that they can be damaged by the slightest sliding of them across the supporting printed circuit board. Thus, any sliding movement of the cover along the printed circuit should be avoided.

SUMMARY OF THE INVENTION

The invention comprises a microelectronic circuit chip carrier having a base that may include an orifice extending through the base and a substrate including electrical conductors mounted on the base, the substrate including a rectangular aperture which is aligned with the orifice of the base. A semiconductor chip is located and supported by the rectangular aperture. A transparent cover is retained over the chip by a resilient metallic clip.

BRIEF DESCRIPTION OF THE DRAWINGS

FIG. 2 is an enlarged exploded view in perspective of the preferred embodiment of the invention;

FIG. 4 is a sectional view of the carrier illustrated in FIG. 2 showing the semiconductor chip positioned in the carrier.

DESCRIPTION OF THE PREFERRED EMBODIMENT

Figure 1:
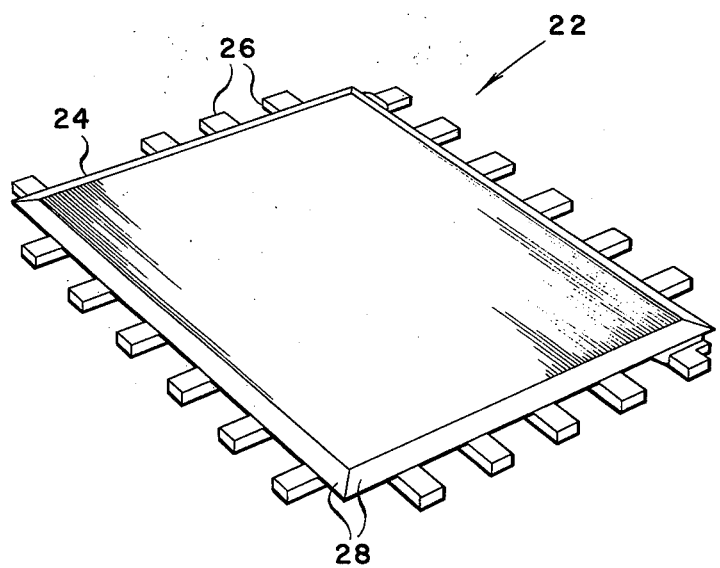
FIG. 1 is an enlarged perspective view of a semiconductor beam lead chip.

In the drawings, the same reference numbers are used throughout the several views to designate the same or similar components. Referring first to FIG. 2, there is shown an exploded perspective view of a typical carrier for protecting a beam lead chip against damage during handling and testing. The carrier includes a base member 2, a circuit board 4, a cover 6, and a resilient clip 8. The beam lead chip, as will be explained fully below, is placed on the circuit board 4 and the cover 6 is placed over the chip and is held in a nonmovable position by resilient clip 8. The base 2 may also contain a plurality of protruding walls 10, ports 12, recesses 14, and the like which may be used to lock the base in automatic carrying equipment, testing equipment or the like, as well as to facilitate stacking and to safeguard or prevent incorrect alignment in the test set up.

Base 2 may also include a generally centrally located open-ended orifice or passageway 16 extending therethrough. A rectangular aperture 18 in circuit board 4 is aligned with orifice 16, and as will be explained below, it is shaped and sized to receive and hold the beam lead chip in the desired position. A plurality of electrically conductive leads or paths 20 on circuit board 4 extend to a location adjacent to rectangular orifice 18 and are arranged to correspond with the beam leads on the chips to be carried and tested The number and arrangement of the leads 20 will be dependent upon the number and orientation of the beam leads on the beam lead chip that is to be transported or tested by the carrier device. Leads 20 may be fabricated on circuit board 4 by methods well known in the art.

FIG. 1 illustrates a typical beam lead chip 22 which may comprise a body 24 and a plurality of outwardly extending or protruding beam leads 26. The body 24 is rectangular in shape and includes tapered sides 28.

Figure 3:
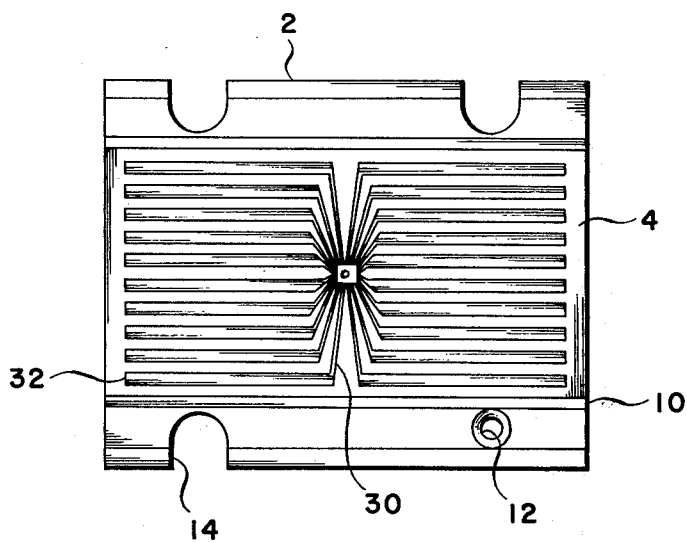
FIG. 3 is an enlarged elevated view of one embodiment of the carrier substrate.

FIG. 3 is an enlarged view of the base 2 and the circuit board 4. As shown, the electrically conductive leads 20 may have a narrow portion 30 adjacent to the aperture 18 and a wider or thicker portion 32 removed therefrom to facilitate making electrical contact to leads 20 for testing the beam lead chip.

FIG. 4 illustrates an assembly of the beam lead chip 22 mounted in the chip carrier. This cross-section illustrates how the circuit board 4 cooperates with the tapered sides 28 of the beam lead chip 22 to maintain alignment and electrical contact between the beam leads of the chip and the electrical leads 20 formed on the circuit board. The beam lead chip 22 is inverted and inserted into rectangular aperture 18 of circuit board 4. Rectangular aperture 18 is sized so that the beam lead chip 22 snugly fits in the aperture.

The dimensions of the beam lead chip 22 and the beam leads 26 may vary but typical dimensions are about 0.070 inch square for the body of the beam lead chip and about 0.005 inch wide by about 0.005 inch long for the beam leads 26.

Although a carrier having an orifice in the base has been illustrated and described, one skilled in the art will know that variations are possible within the purview of this invention. The carrier can be constructed with a vacuum orifice only in the center of the cover 6; with a vacuum orifice only in the base 2; with vacuum orifices in both the cover and the base; or with no vacuum orifices in either the cover or the base. The choice is dependent on the loading and unloading system to be employed to insert and remove the semiconductor chip from the carrier.

Although a carrier having a separate substrate is illustrated and described, one skilled in the art will know that a carrier can be constructed wherein the substrate and base are fabricated as one piece.

One loading technique for placing the beam lead chips in the carrier is to dispose the chips on a glass plate after they have been cut out of a wafer, as is well known in the prior art. A first vacuum probe (not shown), which is mounted on a swivelable arm, may be positioned over the inverted beam lead chip 22. Using the vacuum probe as a lifting device, the beam lead chip 22 is picked up and positioned over the rectangular aperture 18 of circuit board 4. Another vacuum probe (not shown) may be positioned under the base 2 in alignment with orifice 16 and rectangular aperture 18 to hold semiconductor chip 22 in position and to help in aligning the chip with the rectangular aperture while the first vacuum probe is removed. Cover 6 is then placed over the inverted beam lead chip 22. While cover 16 is held against movement to minimize damage to the chip, resilient clip 8 is installed with the corregated leg under the base 2 and the J-shaped leg in intimate contact with cover 6. The resiliency of resilient clip 8 urges cover 6 in intimate contact with chip 22 to keep it from moving relative to circuit board 4. This also urges beam leads 26 into intimate contact with electrically conductive leads or paths 20 to facilitate complete testing of the chip without removing it from the carrier.

There are a number of other loading systems which may be used to insert the beam lead chip into the carrier. For example, the chips can be mounted on cover 6 and held there by wax while the cover and chip, as a unit, are inverted and assembled in the carrier. Another technique is to hold the chip to the cover 6 by applying vacuum to a hole in the cover while the cover and the chip, as a unit, are inverted and assembled in the carrier.

The carrier device, once loaded, may be safely transported without damage to the chip. This permits a "burn-in" test and all other electrical tests which are highly desirable to this type of semiconductor device. The chip does not have to be removed from the carrier for any purpose prior to mounting the chip in a hybrid circuit, or the like.

To unload the chip 22 from the carrier, the resilient clip 8 is removed by spreading the legs of the clip while retaining the base 2, circuit board 4, chip 22 and the cover 6 in a fixed position. The cover 6 can then be removed. If desirable, a vacuum probe (not shown) may be positioned at orifice 16 to assure retention of the chip 22 while cover 6 is being removed. A swivelable vacuum probe (not shown) may then be positioned over the chip to transport the chip to its desired position on a hybrid circuit or the like.

There are a number of other unloading systems which may be used to remove chips from the carrier. For example, the carrier may be inverted and the chip held on the glass cover 6 by a vacuum probe (not shown) through the hole in the cover, while the carrier base 2 and circuit board 4 are removed. One technique for unloading the chip from the carrier by this method is shown in co-pending patent application Ser. No. 592,126 filed June 30, 1975 by T. R. Sherwood, assigned to the same Assignee.

It may be seen that there has been described herein a novel and improved beam lead chip carrier device. While the description herein is presently considered to be preferred, it is contemplated that further modifications and improvements within the purview of those skilled in the art may be made herein. The following claims are intended to cover all variations and modifications as fall within the true spirt and scope of the invention.

What is claimed:

1. A carrier for a microelectronic-circuit chip having beam leads to facilitate handling and testing operations, comprising:
   a base including a surface,
   a substrate mounted on the surface of said base,
   said substrate including a plurality of electrically conductive paths,
   said substrate further including a rectangular aperture through said substrate,
   each of said electrically conductive paths having an end adjacent said rectangular aperture,
   a microelectronic-circuit chip,
   said microelectronic-circuit chip further defined as being substantially rectangular in shape and having tapered sides,
   said microelectronic-circuit chip including a plurality of beam leads protruding from said circuit chip,
   said circuit chip aligned with said substrate entirely by cooperation of said tapered sides and said rectangular aperture,
   a cover retaining the circuit chip in said rectangular aperture,
   and resilient clip means for releasably holding said cover to said base, and,
   wherein said clip means includes a corregated leg and a J-shaped leg.

2. The carrier of claim 1 wherein said electrically conductive paths on said substrate include a relatively wide portion adjacent the ends of said substrate and a relatively narrow portion adjacent said aperture.

3. The carrier of claim 1 wherein said base includes an orifice aligned with the aperture in said substrate.

4. The carrier of claim 1 wherein said cover includes an orifice aligned with the aperture in said substrate.

5. The carrier of claim 4 wherein said base is further defined as including an orifice aligned with the aperture in said substrate.

* * * * *

UNITED STATES PATENT OFFICE
CERTIFICATE OF CORRECTION

Patent No. 3,963,315　　　　　　　　　Dated June 15, 1976

Inventor(s) Scott A. Bonis

It is certified that error appears in the above-identified patent and that said Letters Patent are hereby corrected as shown below:

Column 1, line 4, after the heading, insert the following paragraph:

--The invention herein described was made in the course of or under a contract or subcontract thereunder, with the Navy Department.--

Signed and Sealed this

Twenty-eighth Day of September 1976

[SEAL]

Attest:

RUTH C. MASON
Attesting Officer

C. MARSHALL DANN
Commissioner of Patents and Trademarks